(12) United States Patent
Xu et al.

(10) Patent No.: US 10,546,851 B2
(45) Date of Patent: Jan. 28, 2020

(54) SUBSTRATE AND DISPLAY DEVICE CONTAINING THE SAME

(71) Applicant: BOE TECHNOLOGY GROUP CO., LTD, Beijing (CN)

(72) Inventors: Pan Xu, Beijing (CN); Yongqian Li, Beijing (CN); Quanhu Li, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 293 days.

(21) Appl. No.: 15/509,714

(22) PCT Filed: Sep. 21, 2016

(86) PCT No.: PCT/CN2016/099545
§ 371 (c)(1),
(2) Date: Mar. 8, 2017

(87) PCT Pub. No.: WO2017/128738
PCT Pub. Date: Aug. 3, 2017

(65) Prior Publication Data
US 2018/0233498 A1 Aug. 16, 2018

(30) Foreign Application Priority Data

Jan. 25, 2016 (CN) .......................... 2016 1 0048872

(51) Int. Cl.
*H01L 27/02* (2006.01)
*G02F 1/1362* (2006.01)
(Continued)

(52) U.S. Cl.
CPC .... *H01L 27/0292* (2013.01); *G02F 1/136204* (2013.01); *H01L 27/124* (2013.01); *H01L 29/788* (2013.01); *G02F 2201/121* (2013.01)

(58) Field of Classification Search
CPC ........ H02H 9/02; H02H 9/025; G02F 1/1362; G02F 1/136204; G02F 2201/121;
(Continued)

(56) References Cited

U.S. PATENT DOCUMENTS

| 6,175,394 B1* | 1/2001 | Wu ................... G02F 1/136204 257/360 |
| 2005/0023614 A1 | 2/2005 | Lai |
| 2015/0201487 A1* | 7/2015 | Kee ................... G02F 1/133305 361/749 |

FOREIGN PATENT DOCUMENTS

| CN | 1581480 A | 2/2005 |
| CN | 101201520 A | 6/2008 |

(Continued)

OTHER PUBLICATIONS

CN-101201520; LCD device array substrate with ESD protection function; Date: Jun. 18, 2008 (Year: 2008).*

(Continued)

*Primary Examiner* — Dharti H Patel
(74) *Attorney, Agent, or Firm* — Anova Law Group, PLLC (57) ABSTRACT

The present disclosure provides a substrate, including: a first line; a second line; a thin-film transistor (TFT) between the first line and the second line, having a floating gate structure, a source electrode electrically connected to the first line, and a drain electrode electrically connected to the second line; and a first point-discharge structure between the floating gate structure of the TFT and the first line.

19 Claims, 4 Drawing Sheets

(51) Int. Cl.
*H01L 27/12* (2006.01)
*H01L 29/788* (2006.01)

(58) Field of Classification Search
CPC ........... G02F 1/136286; H01L 27/0292; H01L 27/124; H01L 29/788; H01L 27/0288; H01L 23/60
USPC .......................................................... 361/56
See application file for complete search history.

(56) References Cited

FOREIGN PATENT DOCUMENTS

| | | |
|---|---|---|
| CN | 101241908 A | 8/2008 |
| CN | 103913865 A | 7/2014 |
| CN | 105487317 A | 4/2016 |
| CN | 205542778 U | 8/2016 |

OTHER PUBLICATIONS

The World Intellectual Property Organization (WIPO) International Search Report and Written Opinion for PCT/CN2016/099545 dated Dec. 21, 2016 15 Pages.
The European Patent Office (EPO), The Extended European Search Report for 16845337.1, dated Jul. 19, 2019, 6 Pages.

* cited by examiner

SUBSTRATE AND DISPLAY DEVICE CONTAINING THE SAME

CROSS-REFERENCES TO RELATED APPLICATIONS

This application is a national phase entry under 35 U.S.C. § 371 of International Application No. PCT/CN2016/099545, filed on Sep. 21, 2016, which claims priority to Chinese Patent Application No. 201610048872.4, filed on Jan. 25, 2016. The above enumerated patent applications are incorporated by reference herein in their entirety.

TECHNICAL FIELD

The present invention generally relates to the display technologies and, more particularly, relates to a substrate and a display device containing the substrate.

BACKGROUND

To prevent or reduce electrostatic charges, in conventional display devices, electrostatic discharge (ESD) devices or mechanisms are often arranged on the substrate. Existing ESD devices often use floating gate structures to discharge extra electrostatic charges in the display devices.

Further, to reduce leakage current and ensure proper functions of signals, couplings capacitors in a conventional display device often occupy an undesirably large layout area. As a result, because of the coupling capacitors, the wirings in a conventional display device may not be well arranged, and the device arrangement on the substrate need to be improved.

BRIEF SUMMARY

The present disclosure provides an ESD device, and a substrate and a display device containing the ESD device. The ESD devices applied in the substrate occupy less layout areas compared to conventional technology. Thus, the wirings and device arrangement on the substrate can be easier.

One aspect of the present disclosure includes a substrate, including: a first line; a second line; a thin-film transistor (TFT) between the first line and the second line, having a floating gate structure, a source electrode electrically connected to the first line, and a drain electrode electrically connected to the second line; and a first point-discharge structure between the floating gate structure of the TFT and the first line.

Optionally, the substrate further includes a second point-discharge structure between the floating gate structure of the TFT and the second line.

Optionally, the first line is a signal line and the second line is an electrostatic discharge (ESD) bus line.

Optionally, the substrate comprises a plurality of signal lines and one ESD bus line.

Optionally, the ESD bus line comprises a protruding portion, the protruding portion and a corresponding signal line forming a one-to-one correspondence, wherein for the ESD bus line and the corresponding signal line: at least a part of the protruding portion of the ESD bus line is aligned in a direction parallel to a direction the corresponding signal line is aligned, the TFT being between the protruding portion and the corresponding signal line, and the drain electrode of the TFT being electrically connected to the protruding portion; a longitudinal direction of the floating gate structure is parallel to the direction the corresponding signal line is aligned; and the second point-discharge structure is between the floating gate structure and the protruding portion.

Optionally, the ESD bus line includes a protruding portion, the protruding portion and a corresponding signal line forming a one-to-one correspondence, wherein for the ESD bus line and the corresponding signal line: at least a part of the protruding portion of the ESD bus line is aligned in a direction parallel to a direction the corresponding signal line is aligned, the TFT being between the protruding portion and the corresponding signal line, and the drain electrode of the TFT being electrically connected to the protruding portion; a longitudinal direction of the floating gate structure is perpendicular to the direction the corresponding signal line is aligned; and the second point-discharge structure is between the floating gate structure and the protruding portion.

Optionally, a direction the ESD bus line is aligned is perpendicular to the direction the corresponding signal line is aligned.

Optionally, a direction the ESD bus line is aligned is perpendicular to the direction the corresponding signal line is aligned.

Optionally, the floating gate structure faces an active layer of the TFT and the active layer is made of a semiconductor oxide material.

Optionally, two first point-discharge structures are arranged between the floating gate structure of the TFT and the corresponding first line; and along the longitudinal direction of the floating gate structure, one of the two first point-discharge structure is closer to one side of the active layer of the TFT, and another one of the two first point-discharge structure is closer to another side of the active layer of the TFT.

Optionally, one first point-discharge structure is arranged between the floating gate structure of a TFT and the corresponding first line; and along the longitudinal direction of the floating gate structure, the one first point-discharge structure is arranged at a middle position of the floating gate structure.

Optionally, one first point-discharge structure is arranged between the floating gate structure of a TFT and the corresponding first line, and one second point-discharge structure is arranged between the floating gate structure of the TFT and the corresponding second line; and along the longitudinal direction of the floating gate structure, the one first point-discharge structure between the floating gate structure and the corresponding first line is closer to one side of the active layer of the TFT, and the one second point-discharge structure between the floating gate structure and the corresponding second line is closer to another side of the active layer of the TFT.

Optionally, the substrate is a TFT substrate with data lines and gate lines, the signal lines including at least one of the data lines and the gate lines.

Optionally, the substrate is a touch substrate with touch lines, the signal lines including the touch lines.

Optionally, the substrate is a color filter substrate with common electrode lines, the signal lines including the common electrode lines.

Optionally, the substrate is an organic light-emitting diode back panel with power signal lines, the signal lines including the power signal lines.

Optionally, the floating gate structures and the first lines are formed through a same fabrication step.

Optionally, the floating gate structures and the second lines are formed through a same fabrication step.

Another aspect of the present disclosure provides a display device, including one or more of the disclosed substrates.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
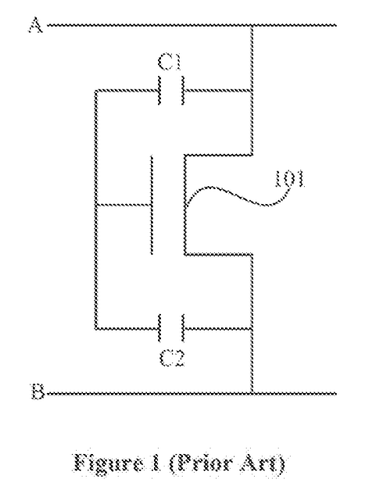
FIG. 1 illustrates the working principles of conventional ESD devices.

In many ESD devices the arrangement of the ESD circuits may cause the device layout to be undesirably space-consuming. FIG. 1 illustrates the working principles of a conventional ESD device. As shown in FIG. 1, a thin-film transistor (TFT) 101, a coupling capacitor C1, and a coupling capacitor C2 are arranged between a signal line B and a bus line A. The coupling capacitor C1 is arranged between the floating gate structure and the source electrode of the TFT 101. The coupling capacitor C2 is arranged between the floating gate structure and the drain electrode of the TFT 101. In operation, to reduce leakage current and ensure proper functions of signals, the capacitance of the coupling capacitors C1 and C2 need to be sufficiently high. Accordingly, the coupling capacitors C1 and C2 may be undesirably space-consuming and require an undesirably large layout area. As a result, the wirings in a conventional display device may not be well arranged, and the device arrangement on the substrate need to be improved.

Embodiments of the present disclosure provide a substrate. The substrate may include a disclosed ESD device.

In the present disclosure, a signal line may also be referred as a first line and an ESD bus line may also be referred as a second line. The signal line and the ESD bus line are used as examples to illustrate the present disclosure. In various embodiments, the first line and the second line may also be other suitable lines.

The ESD device may include point-discharge structures. The substrate may carry a plurality of the disclosed ESD devices. The substrate may include a plurality of TFTs. A TFT on the substrate may include a floating gate structure facing or corresponding to the active layer of the TFT. At least one point-discharge structure may be arranged between the floating gate structure and a signal line. In some embodiments, at least one point-discharge structure may also be arranged between the floating gate structure and the ESD bus line. A point-discharge structure may include a pair of point discharge pins. The point-discharge structures may occupy less layout area on the substrate, making it easier for wiring arrangement on the substrate. Also, the device arrangement on the substrate can be improved.

Various devices may also be arranged as arrays on the substrate. The various devices may include switching devices, optical devices, sensing devices, and so on. The substrate may be any suitable TFT substrates, color filter substrates, touch substrates, organic light-emitting diode (OLED) back panels, etc.

The first line or signal line may include any suitable lines for transmitting electrical signals, such as scanning signal lines, data signal lines, common electrode lines, touch signal lines, power signal lines, etc.

Figure 2:
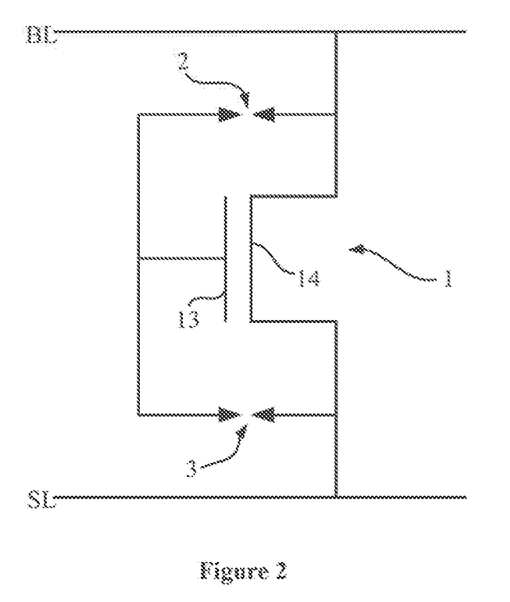
FIG. 2 illustrates the working principles of an exemplary ESD device according to various disclosed embodiments of the present disclosure.
Figure 3:
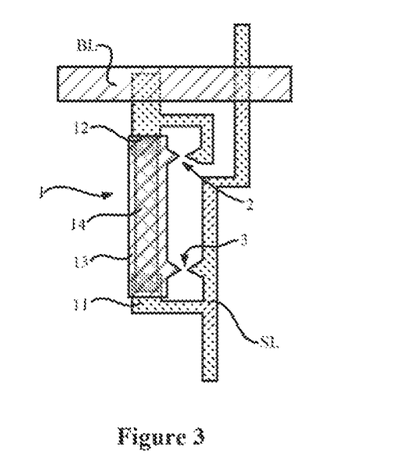
FIG. 3 illustrates the structure of an exemplary ESD circuit according to various disclosed embodiments of the present disclosure.

As shown in FIGS. 2 and 3, the disclosed substrate may include signal lines SL and ESD bus lines BL. A TFT 1 may be arranged between a signal line SL and a bus line BL. The TFT 1 may include a source electrode 11, a drain electrode 12, an active layer 14, and a floating gate structure 13 facing or corresponding to the active layer 14. The source electrode 11 may be electrically connected to the signal line SL. The drain electrode 12 may be electrically connected to the ESD bus line BL. At least one first point-discharge structure 3 may be arranged between the floating gate structure 13 and the signal line SL. FIG. 3 illustrates a first point-discharge structure 3 arranged between the floating gate structure 13 and the signal line SL. As shown in FIG. 3, in some embodiments, a second point-discharge structure 2 may be arranged between the floating gate structure 13 and the ESD bus line BL.

Figure 4:
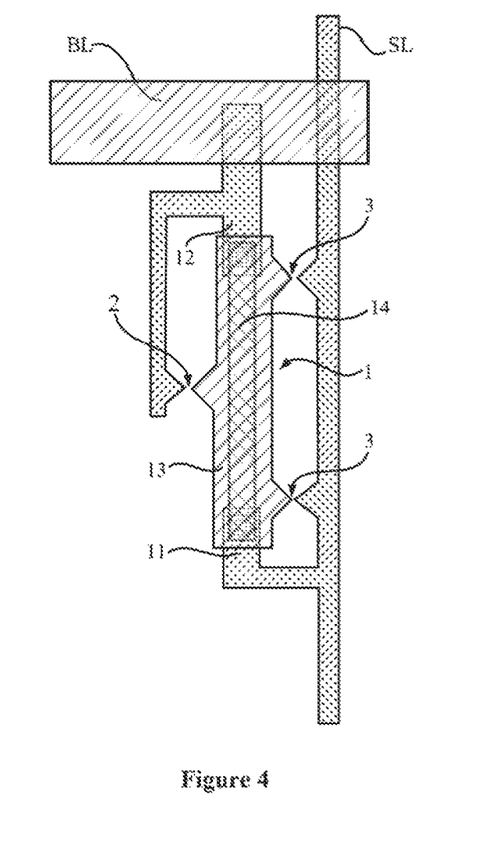
FIG. 4 illustrates the structure of another exemplary ESD circuit according to various disclosed embodiments of the present disclosure.

FIG. 4 illustrates two point-discharge structures 3 arranged between the floating gate structure 13 and the signal line SL. In some embodiments, at least one first point-discharge structure 2 may be arranged between the floating gate structure 13 and the ESD bus line BL. FIG. 4 illustrates one first point-discharge structure 2 arranged between the floating gate structure 13 and the ESD bus line BL.

In the disclosed substrate, the at least one first point-discharge structure 3 arranged between a floating gate structure 13 and a signal line SL may be used to discharge electrostatic charges. For example, when too much electrostatic charge accumulates on the signal line SL to cause a high transient voltage or a voltage spike, the signal line SL may discharge the electrostatic charges through the at least one first point-discharge structure 3 between the signal line SL and the floating gate structure 13. The voltage on the floating gate structure 13 may thus be of a high-level. Further, the active layer 14 of the TFT 1 may be converted to conductor state under the effect of the floating gate structure 13. The active layer 14 may electrically conduct or electrically connect the source electrode 11 and the drain electrode 12 of the TFT 1. That is, the TFT 1 may become transiently conductive. Thus, the electrostatic charges accumulating on the signal line SL may flow through the conductive TFT 1 and be discharged through the ESD bus line BL.

Similarly, the at least one second point-discharge structure 2 between a floating gate structure 13 and an ESD bus line may also be used to discharge electrostatic charges. For example, when too many electrostatic charges accumulate on the ESD bus line BL to cause a high transient voltage or a voltage spike, the ESD bus line SL may discharge the electrostatic charges through the at least one second point-discharge structure 2 between the ESD bus line BL and the floating gate structure 13. The voltage on the floating gate structure 13 may thus be of a high-level. Further, the active layer 14 of the TFT 1 may convert to conductor state under the effect of the floating gate structure 13. The active layer 14 may electrically conduct or electrically connect the source electrode 11 and the drain electrode 12 of the TFT 1. That is, the TFT 1 may become transiently conductive. Thus, the electrostatic charges accumulating on the signal line SL may flow through the conductive TFT 1 and be discharged through the signal line SL.

The point-discharge structures arranged between the floating gate structure 13 of the TFT 1 and the signal line SL/the ESD bus line BL, on the substrate, may rapidly discharge electrostatic charges. Because point-discharges structures often have simple structures and are small in size, using point-discharge structures for discharging electrostatic charges in the substrate may require smaller layout areas. It is thus easier to arrange wirings and devices in the substrate, and the device arrangement on the substrate can be improved.

In some embodiments, the active layer 14 of the TFT 1 may be made of a suitable oxide semiconductor material.

Because the active layer 14 of the TFT 1 is made of an oxide semiconductor material, the active layer 14 may increase the channel length of the TFT 1. The active layer 14 may also effectively reduce the impact threshold voltage shift of the TFT 1 and the leakage current of oxide TFTs. The active layer 14 may further reduce the layout area for disposing the TFT 1.

In the disclosed substrate, the signal lines SL, the ESD bus lines BL, and the floating gate structures 13 may be arranged in a number of ways.

Figure 5:
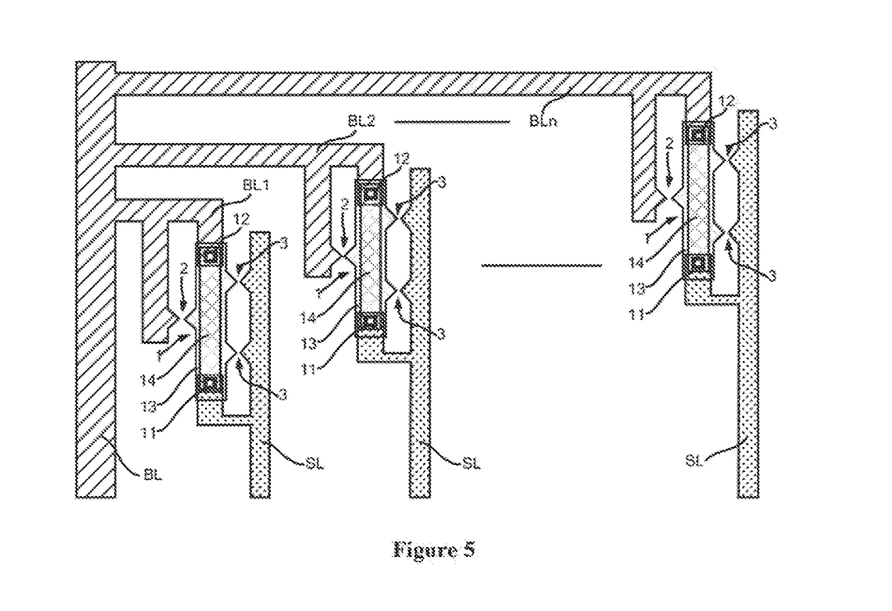
FIG. 5 illustrates an exemplary arrangement of ESD circuits according to various disclosed embodiments of the present disclosure.

FIG. 5 illustrates an exemplary arrangement of the signal lines SL, the ESD bus lines BL, and the floating gate structures 13. As shown in FIG. 5, the signal lines SL may be arranged to be parallel to the ESD bus lines BL. An ESD bus line BL may include a plurality of protruding portions. A protruding portion and a signal line SL may form a one-to-one correspondence. For example, protruding portions BL1, BL2, . . . , and BLn may each correspond to a signal line SL.

For each SL and the corresponding protruding portion, at least one part of the protruding portion is arranged to be parallel to the direction the signal lines SL are aligned. A TFT 1 may be disposed between the protruding portion and the signal line SL. In the TFT 1, the drain electrode 12 may be electrically connected to the protruding portion. The longitudinal direction of the floating gate structure 13 may be parallel to the direction the corresponding signal lines SL is aligned. The at least one second point-discharge structure 2 between the floating gate structure 13 and the ESD bus line BL may be between the floating gate structure 13 and the protruding portion of the ESD bus line BL. In the present disclosure, the longitudinal direction of a floating gate structure 13 represents the direction along which the drain electrode 12, the active layer 14, and the source electrode 11 of the TFT 1 are aligned.

Figure 6:
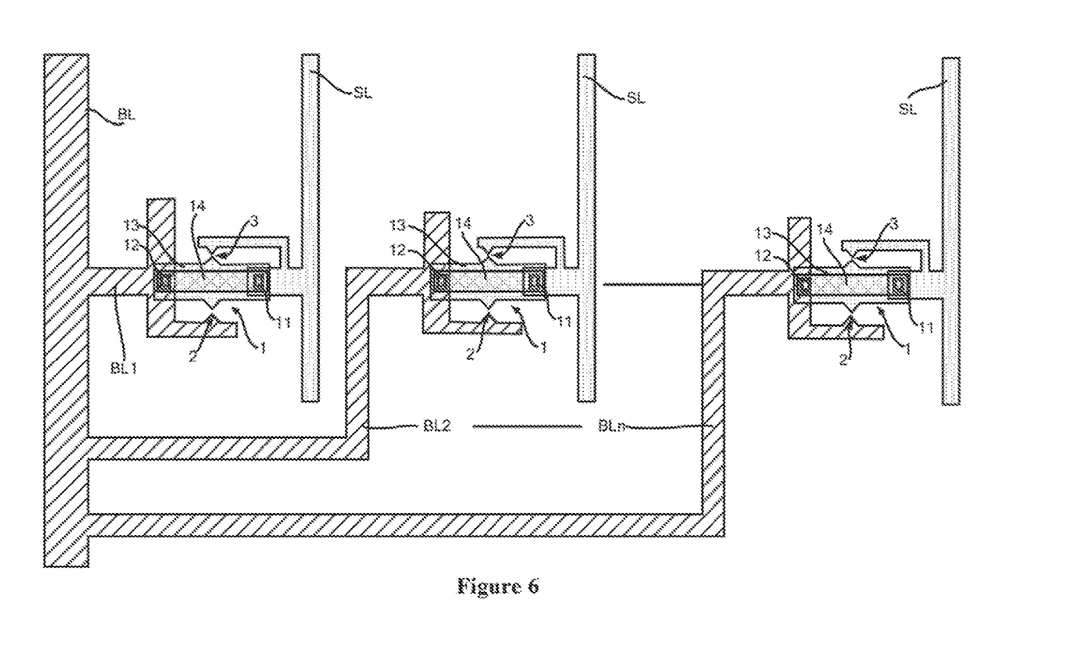
FIG. 6 illustrates another exemplary arrangement of ESD circuits according to various disclosed embodiments of the present disclosure.

FIG. 6 illustrates another exemplary arrangement of the signal lines SL, the ESD bus lines BL, and the floating gate structures 13. As shown in FIG. 6, the signal lines SL may be arranged to be parallel to the ESD bus lines BL. An ESD bus line BL may include a plurality of protruding portions. A protruding portion and a signal line SL may form a one-to-one correspondence. For example, protruding portions BL1, BL2, . . . , and BLn may each correspond to a signal line SL.

For each SL and the corresponding protruding portion, at least one part of the protruding portion is arranged to be parallel to the direction the signal lines SL are aligned. A TFT 1 may be arranged between the protruding portion and the signal line SL. In the TFT 1, the drain electrode 12 may be electrically connected to the protruding portion. The longitudinal direction of the floating gate structure 13 may be perpendicular to the direction the corresponding signal line SL is aligned or may be parallel to the direction the ESD bus line is aligned. The at least one second point-discharge structure 2 between the floating gate structure 13 and the ESD bus line BL may be between the floating gate structure 13 and the protruding portion of the ESD bus line BL.

Figure 7:
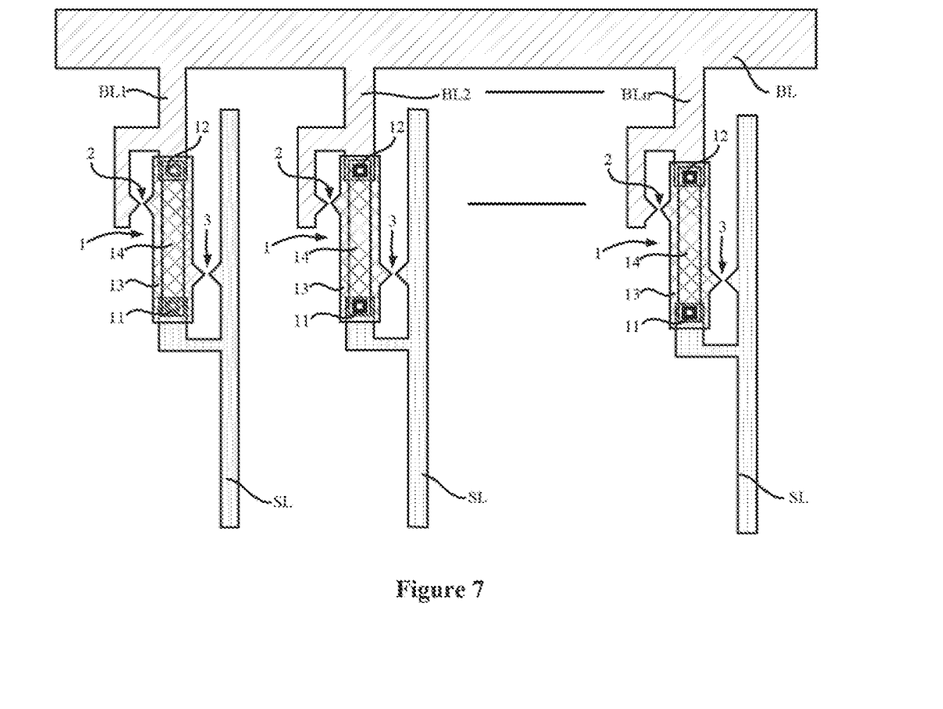
FIG. 7 illustrates another exemplary arrangement of ESD circuits according to various disclosed embodiments of the present disclosure.

FIG. 7 illustrates another exemplary arrangement of the signal lines SL, the ESD bus lines BL, and the floating gate structures 13. The direction the signal lines SL are aligned may intersect with the direction the ESD bus lines BL are aligned. As shown in FIG. 7, for example, the direction the signal lines SL are aligned may be perpendicularly intersecting with the direction the ESD bus lines BL are aligned. An ESD bus line BL may include a plurality of protruding portions. A protruding portion and a signal line SL may form a one-to-one correspondence. For example, protruding portions BL1, BL2, . . . , and BLn may each correspond to a signal line SL.

For each SL and the corresponding protruding portion, at least one part of the protruding portion is arranged to be parallel to the direction the corresponding signal line SL is aligned. A TFT 1 may be arranged between the protruding portion and the signal line SL. In the TFT 1, the longitudinal direction of the floating gate structure 13 may be parallel to the direction the signal line SL is arranged.

Figure 8:
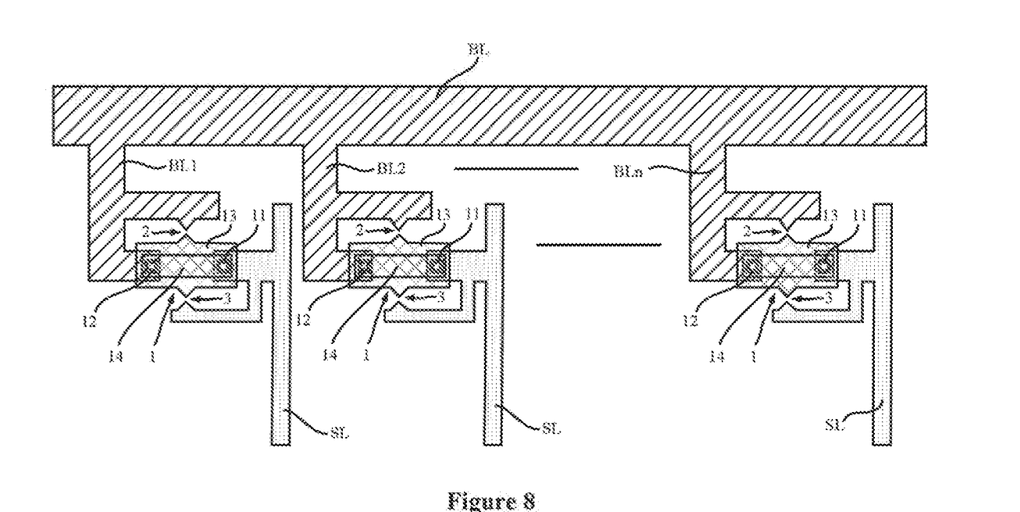
FIG. 8 illustrates another exemplary arrangement of ESD circuits according to various disclosed embodiments of the present disclosure.

FIG. 8 illustrates another exemplary arrangement of the signal lines SL, the ESD bus lines BL, and the floating gate structures 13. The direction the signal lines SL are aligned may intersect with the direction the ESD bus lines BL are aligned. As shown in FIG. 8, for example, the direction the signal lines SL are aligned may be perpendicularly intersecting with the direction the ESD bus lines BL are aligned. The ESD bus line BL may include a plurality of protruding portions. A protruding portion and a signal line SL may form a one-to-one correspondence. For example, protruding portions BL1, BL2, . . . , and BLn may each correspond to a signal line SL.

For each SL and the corresponding protruding portion, at least one part of the protruding portion is arranged to be perpendicular to the direction the corresponding signal line SL is aligned. A TFT 1 may be arranged between the protruding portion and the signal line SL. In the TFT 1, the longitudinal direction of the floating gate structure 13 may be parallel to the direction the corresponding ESD line BL is aligned or perpendicular to the direction the corresponding signal line SL is aligned.

In one embodiment, as shown in FIG. 4, two point-discharge structures 3 may be arranged between the floating gate structure 13 of at least one TFT 1 and the corresponding signal line SL. Along the longitudinal direction of the floating gate structure 13, two point-discharge structures 3 may be arranged between the floating gate structure 13 and the signal line SL. One first point-discharge structure 3 may be arranged closer to one side of the active layer 14 of the TFT 1, and the other first point-discharge structure 3 may be arranged closer to the other side of the active layer 14 of the TFT 1. That is, one first point-discharge structure 3 may be arranged to be closer to the side that is closer to the ESD bus line BL, and the other first point-discharge structure 3 may be arranged closer to the side that is farther away from the ESD bus line BL.

As shown in FIG. 4, two point-discharge structures 3 may be arranged between the floating gate structure 13 of the TFT 1 and the signal line SL. Along the longitudinal direction of the floating gate structure 13, the two point-discharge structures 3 may each be arranged closer to a different side of the active layer 14 of the TFT 1. When too many electrostatic charges accumulate on the signal line SL to cause a high transient voltage, the accumulating electrostatic charges may be rapidly discharged through the two point-discharge structures 3, which are positioned closer to the two different sides of the active layer 14 of the TFT 1. The electrostatic charges may be more uniformly and rapidly distributed in the floating gate structure 13. Accordingly, the voltage on the floating gate structure 13 may rapidly increase to be of high-level, and the active layer 14 of the TFT 1 may be transiently converted to conductor state under the effect of the floating gate structure 13. The two point-discharge structures 3 may decrease the conducting time between the source electrode 11 and the drain electrode 12, so that the electrostatic charges accumulating on the signal line SL may flow through the transiently conductive TFT 1 and be discharged to the ESD bus line BL. Less time is needed to discharge the electrostatic charges.

Specifically, as shown in FIG. 4, one second point-discharge structure 2 may be arranged between the floating gate structure 13 and the ESD bus line BL. Along the longitudinal direction of the floating gate structure 13, the one second point-discharge structure 2 may be disposed in the middle of the floating gate structure 13.

As shown in FIG. 4, when too much electrostatic charge accumulates on the ESD bus line BL to cause a high transient voltage, the accumulating electrostatic charges may be rapidly discharged through the one second point-discharge structure 2 between the floating gate structure 13 and the ESD bus line BL. Because the one second point-discharge structure 2 is arranged in the middle of the floating gate structure 13 along the longitudinal direction of the floating gate structure 13, the accumulating electrostatic charges may be rapidly distributed to the two sides of the floating gate structure 13 from the middle of the floating gate structure 13. Accordingly, the voltage on the floating gate structure 13 may be of high-level. The active layer 14 of the TFT 1 may be transiently converted to conducting state under the effect of the floating gate structure 13. The one second point-discharge structure 2 may decrease the conducting time between the source electrode 11 and the drain electrode 12, so electrostatic charges accumulating on the ESD bus line BL may flow through the transiently conductive TFT 1 and be discharged through the ESD bus line BL. Less time is needed to discharge the electrostatic charges. In some embodiments, to further reduce the time to discharge the electrostatic charges, two or more point-discharge structures 2 may be arranged between the floating gate structure 13 and the ESD bus line BL.

In some embodiments, with the arrangement shown in FIG. 7 and the ESD circuit illustrated in FIG. 3, the direction the signal lines SL are arranged may be perpendicularly intersecting with the direction the ESD bus lines BL are arranged. One second point-discharge structure 2 may be arranged between a floating gate structure 13 and the ESD bus line BL, and one first point-discharge structure 3 may be arranged between the floating gate structure 13 and the corresponding signal line SL. Along the longitudinal direction of the floating gate structure 13, the second point-discharge structure 2, arranged between the floating gate structure 13 and the ESD bus line BL, may be arranged closer to one side of the active layer 14 of the TFT 1; and the first point-discharge structure 3, arranged between the floating gate structure 13 and the signal line SL, may be arranged closer to the other side of the active layer 14 of the TFT 1.

The substrate may further include one or more of the following substrates. For example, the substrate may be a TFT substrate with data lines and gate lines, and the signal lines SL may include at least one of the data lines and the gate lines. The substrate may be a touch substrate with touch lines, and the signal lines SL may include the touch lines. Also, the substrate may be a color filter substrate with common electrode lines, and the signal lines SL may include common electrode lines. Further, the substrate may be an OLED back panel with power signal lines, and the signal lines SL may include the power signal lines. The substrate may also include other suitable features, components, or properties. The specific types of substrate should be determined according to different applications and should not be limited by the embodiments of the present disclosure.

Further, in some embodiments, the floating gate structures 13 and the signal lines SL may be formed through a same fabrication step. In some other embodiments, the floating gate structures 13 and the ESD bus lines BL may be formed through a same fabrication step.

It should be noted that, in the disclosed embodiments, the signal input terminal of a TFT 1 may be the drain electrode of the TFT 1, and the signal output terminal of the TFT 1 may be the source electrode of the TFT 1. Because the TFT 1 has a symmetric structure, the source electrode and the drain electrode of a TFT 1 may be interchanged according to different applications without limiting the scope of the disclosure.

Another aspect of the present disclosure provides a display device. The display device may include one or more of the disclosed substrates. The display device may be a liquid crystal display (LCD) panel, an electronic paper, an OLED panel, a mobile phone, a tablet computer, a television, a monitor, a laptop computer, a digital camera, a navigation device, or any other products or parts with display functions.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:
1. A substrate, comprising:
a first line;
a second line;
a thin-film transistor (TFT) between the first line and the second line, having a floating gate structure, a source electrode electrically connected to the first line, and a drain electrode electrically connected to the second line; and two first point-discharge structures between the floating gate structure of the TFT and the first line;

wherein along a longitudinal direction of the floating gate structure, one of the two first point-discharge structure is closer to one side of an active layer of the TFT, and another one of the two first point-discharge structure is closer to another side of the active layer of the TFT.

2. The substrate according to claim 1, further comprising a second point-discharge structure between the floating gate structure of the TFT and the second line.

3. The substrate according to claim 2, wherein the floating gate structure and the second line are formed through a same fabrication step.

4. The substrate according to claim 2, wherein the first line is a signal line and the second line is an electrostatic discharge (ESD) bus line.

5. The substrate according to claim 4, wherein the substrate is a TFT substrate with data lines and gate lines, the signal line including one of the data lines or one of the gate lines.

6. The substrate according to claim 4, wherein the substrate is a touch substrate with touch lines, the signal line including one of the touch lines.

7. The substrate according to claim 4, wherein the substrate is a color filter substrate with common electrode lines, the signal line including one of the common electrode lines.

8. The substrate according to claim 4, wherein the substrate is an organic light-emitting diode back panel with power signal lines, the signal line including one of the power signal lines.

9. The substrate according to claim 4, wherein the substrate comprises a plurality of signal lines and one ESD bus line.

10. The substrate according to claim 9, wherein the ESD bus line comprises a protruding portion, the protruding portion and a corresponding signal line forming a one-to-one correspondence, wherein for the ESD bus line and the corresponding signal line:

at least a part of the protruding portion of the ESD bus line is aligned in a direction parallel to a direction the corresponding signal line is aligned, the TFT being between the protruding portion and the corresponding signal line, and the drain electrode of the TFT being electrically connected to the protruding portion;

the longitudinal direction of the floating gate structure is parallel to the direction the corresponding signal line is aligned; and the second point-discharge structure is between the floating gate structure and the protruding portion.

11. The substrate according to claim 10, wherein:

a direction the ESD bus line is aligned is perpendicular to the direction the corresponding signal line is aligned.

12. The substrate according to claim 9, wherein the ESD bus line comprises a protruding portion, the protruding portion and a corresponding signal line forming a one-to-one correspondence, wherein for the ESD bus line and the corresponding signal line:

at least a part of the protruding portion of the ESD bus line is aligned in a direction parallel to a direction the corresponding signal line is aligned, the TFT being between the protruding portion and the corresponding signal line, and the drain electrode of the TFT being electrically connected to the protruding portion;

the longitudinal direction of the floating gate structure is perpendicular to the direction the corresponding signal line is aligned; and the second point-discharge structure is between the floating gate structure and the protruding portion.

13. The substrate according to claim 12, wherein:

a direction the ESD bus line is aligned is perpendicular to the direction the corresponding signal line is aligned.

14. The substrate according to claim 1, wherein the floating gate structure faces the active layer of the TFT and the active layer is made of a semiconductor oxide material.

15. The substrate according to claim 1, wherein the floating gate structure and the first line are formed through a same fabrication step.

16. A display device, comprising one or more of the substrates according to claim 1.

17. A substrate, comprising:

a plurality of signal lines;

an electrostatic discharge (ESD) bus line including a protruding portion, the protruding portion and a corresponding signal line of the plurality of signal lines forming a one-to-one correspondence, and at least a part of the protruding portion of the ESD bus line being aligned in a direction parallel to a direction the corresponding signal line is aligned;

a thin-film transistor (TFT) between the protruding portion and the corresponding signal line, having a floating gate structure with a longitudinal direction parallel or perpendicular to the direction the corresponding signal line is aligned, a source electrode electrically connected to the corresponding signal line, and a drain electrode electrically connected to the protruding portion;

a first point-discharge structure between the floating gate structure of the TFT and the corresponding signal line; and a second point-discharge structure between the floating gate structure of the TFT and the protruding portion.

18. A substrate, comprising:

a first line;

a second line;

a thin-film transistor (TFT) between the first line and the second line, having a floating gate structure, a source electrode electrically connected to the first line, and a drain electrode electrically connected to the second line; and a first point-discharge structure between the floating gate structure of the TFT and the first line;

wherein along a longitudinal direction of the floating gate structure, the first point-discharge structure is arranged at a middle position of the floating gate structure.

19. A substrate, comprising:

a first line;

a second line;

a thin-film transistor (TFT) between the first line and the second line, having a floating gate structure, a source electrode electrically connected to the first line, and a drain electrode electrically connected to the second line;

a first point-discharge structure between the floating gate structure of the TFT and the first line; and a second point-discharge structure between the floating gate structure of the TFT and the second line;

wherein, along a longitudinal direction of the floating gate structure, the first point-discharge structure is closer to one side of an active layer of the TFT and the second point-discharge structure is closer to another side of the active layer of the TFT.

\* \* \* \* \*